United States Patent [19]

Amariti et al.

[11] Patent Number: 4,499,170
[45] Date of Patent: Feb. 12, 1985

[54] LITHOGRAPHIC PLATES AND PHOTORESISTS HAVING STABILIZED PHOTOSENSITIVE DIAZO RESIN WITH THEOPHYLLINE DERIVATIVE

[75] Inventors: Luigi Amariti, Bloomingdale; Llandro C. Santos, Chicago, both of Ill.

[73] Assignee: Richardson Graphics Company, Des Plaines, Ill.

[21] Appl. No.: 505,231

[22] Filed: Jun. 17, 1983

[51] Int. Cl.³ .................. G03C 1/60; G03C 1/74; G03F 7/16
[52] U.S. Cl. .................. 430/169; 430/175; 430/176; 430/179
[58] Field of Search .............. 430/179, 175, 176, 169

[56] References Cited

U.S. PATENT DOCUMENTS

| | | | |
|---|---|---|---|
| 2,270,756 | 1/1942 | Kern | 430/179 |
| 2,617,726 | 11/1952 | Kessels | 430/179 |
| 2,649,373 | 8/1953 | Neugebauer et al. | |
| 2,871,119 | 1/1959 | Weegar et al. | 430/176 |
| 2,937,085 | 5/1960 | Seven et al. | 430/176 |
| 3,300,309 | 1/1967 | Chu | |
| 3,353,984 | 11/1967 | Landau | |
| 3,386,828 | 6/1968 | Slimowicz | 430/179 |
| 3,808,004 | 4/1974 | Thomas et al. | |
| 4,230,492 | 10/1980 | Thomas | |

FOREIGN PATENT DOCUMENTS 51-7915  1/1976  Japan .................. 430/179

*Primary Examiner*—Charles L. Bowers, Jr.
*Attorney, Agent, or Firm*—Lockwood, Alex, Fitzgibbon & Cummings

[57] ABSTRACT

Plates such as those used in lithographic printing and photoresists such as those used in preparing printed circuit boards and the like are provided with a photopolymerizable photosensitive diazo resin that is unusually stable. The diazo resin is laid down from a stabilized diazonium composition that is an emulsion including the selected diazo resin, a purine derivative, especially a theophylline derivative, preferably in combination with a salt of a low molecular weight alkyl sulfonic acid or other supplementary stabilizer component.

17 Claims, No Drawings

LITHOGRAPHIC PLATES AND PHOTORESISTS HAVING STABILIZED PHOTOSENSITIVE DIAZO RESIN WITH THEOPHYLLINE DERIVATIVE

BACKGROUND AND DESCRIPTION OF THE INVENTION

This invention generally relates to photosensitive articles that include a stabilized diazonium composition and a method associated therewith. More particularly, the invention relates to the use of purine derivatives in preparing plates or photoresists, which purine derivatives are incorporated into a diazonium composition that is utilized in making the plate or photoresist. Preferably, this diazonium composition also includes a supplementary stabilizer component, such as a zinc salt including inorganic salts such as zinc chloride, or preferably a low molecular weight alkyl sulfonic acid zinc salt. A polymer binder may also be included within the diazonium composition in order to assist in maintaining the composition as an emulsion.

It has long been known to utilize diazonium materials in connection with the preparation of products such as lithographic printing plates and photoresists such as are provided relative to printed circuit boards. For convenience, when reference is made hereinafter to a "plate", that term is intended to include products having generally rigid substrates and diazonium compositions coated thereonto, including lithographic printing plates, photoresists and the like. Often, such plates must be stored for extended periods of time between preparation of the plate and its use when same is selectively exposed and developed or otherwise put into use. When subjected to storage for extended periods of time, there is a tendency for the diazonium material of such plates to undergo reactions that detract from the overall sensitivity of the diazonium material present on the plate.

Previously practiced approaches for stabilizing these plates include reacting the diazonium material with a complexing agent in order to "tie up" the reactive diazonium group while attempting to retain a substantial amount of the light sensitivity of the diazonium material. Typically, these stabilization techniques are intended to enhance the resistance of the diazonium material to environmental moisture which can lead to undesirable physical and chemical changes of the diazonium material during extended periods of storage. Other approaches include interposing a stabilizer layer between the diazonium material and a substrate component or coating which would adversely affect the diazonium compound.

Diazonium material stabilization is believed to inhibit, under storage conditions, reactions by which the diazonium groups thereof are degraded and rendered less sensitive to light. In this case, such a reaction results in a premature "tanning" of the diazonium material over the general surface area of the plate, thereby reducing the contrast between the background area and the areas of the plate that are selectively exposed at the time that the plate is put into use by exposure and development in order to form the desired image on the surface of the plate. Stabilization of diazonium materials which are coated upon plates that are to be stored for extensive time periods should take into consideration the reactivity of the diazonium group itself. Plate stabilization should also consider the tendency of many diazo condensates to undergo dimerization, trimerization and/or cross-linking, which forms polymers that, because of their increased molecular weight, are insoluble even though they include reactive diazonium groups. Because of this, the solubility differential between the exposed and unexposed areas is substantially reduced when the plate is subsequently used, which phenomena is commonly known as "scumming."

Plates that are stabilized in this manner are prepared in accordance with the present invention by providing a diazonium sensitizer composition that includes a diazonium compound and a stabilizing system that includes a purine derivative, especially a theophylline derivative, preferably in combination with a supplementary stabilizer component such as a salt of a low molecular weight alkyl sulfonic acid or an inorganic zinc salt. An emulsion polymer binder may also be included to assist in stabilizing the sensitizing solution, typically while enhancing the ink receptivity of the diazonium composition.

It is accordingly a general object of the present invention to provide a plate of improved stability.

Another object of this invention is an improved lithographic printing plate and method of providing same in an unusually stable condition.

Another object of this invention is to provide a photoresist having enhanced stability.

Another object of the present invention is to utilize a purine derivative, especially a theophylline derivative, as a plate constituent for enhancing the shelf stability thereof.

Another object of the present invention is to provide an improved additive or subtractive negative working plate which has an especially stable diazonium material that is rendered insoluble upon exposure to actinic radiation.

Another object of this invention is to provide an improved additive or subtractive positive working plate that includes a stabilized diazonium material that is rendered soluble upon exposure to actinic radiation.

These and other objects of the present invention will be apparent from the following further deatiled description of this invention.

Plates, especially those intended for use in lithographic or planographic printing processes, include a plate base or support member, a layer and/or treatment for rendering the plate base or support member more suitable for use as a plate, and one or more layers of a sensitizer coating that is photopolymerizable in response to actinic radiation. When desired, protective coatings can also be included. The photopolymerizable sensitizer layer or layers of the plate in accordance with this invention include a diazonium material that is laid down from a diazonium composition which includes a stabilizing system. Usually, the stabilizing system will be included in the diazonium composition in order to inhibit what are believed to be chemical reactions including dimerization and/or trimerization of diazo condensates and the regressive reaction of diazonium groups thereof into precursors of the diazonium group such as $-NH_2$, $-NO_2$ and/or $-NO$ groups.

The stabilized diazonium composition according to this invention includes the desired diazo resin material that is responsive to actinic radiation, a purine derivative, especially a theophylline derivative, preferably in combination with a supplementary stabilizer component such as a salt of a low molecular weight alkyl sulfonic acid or an inorganic salt stabilizer.

Typically, the support member or plate base is a flexible sheet-like material composed of metal, plastic, or the like. In this regard, it is important to note that the present invention finds advantageous utility with anodized aluminum plate bases. In accordance with known techniques, the anodized plate base is brush grained or otherwise suitably treated to improve its ability to bond with a sub-base coating thereover and then washed to remove oils and contaminants which may be present on the surface thereof after such operations.

Numerous sub-base coating materials are available, including phytic acid, melamine-formaldehyde condensation resin overcoated with polyacrylamide, and thereafter treated with zirconium acetate, urea-formaldehyde, titanium ortho esters, silane-acrylics and a silicate sub-bases such as described in U.S. Pat. No. 2,714,066. In addition, other sub-bases which are typically used on plates include gelatin, polyacrylic acid and water soluble salts thereof, polymethacrylic acid and water soluble salts thereof, carboxymethyl cellulose, carboxymethyl hydroxyethyl cellulose, some titanates, modified resins of urea-formaldehyde and melamine-formaldehydes, polyvinyl alcohols, ferrocyanides, bicromates of sodium, potassium and ammonium, and oxides of the metal forming the plate as well as other sub-base materials. Combinations of the above are also included.

Stabilized diazonium compositions in accordance with this invention are polymeric water emulsions that include a stabilizer system and a diazonium material, typically added as an aldehyde condensate. The diazo condensate will be included within the composition at a concentration of between about 0.03 to 3 weight percent, based upon the total stabilized sensitizer composition, a more preferred range being between about 0.1 and about 1 weight percent. The purine derivative of the stabilizer system is included at a concentration of between about 1 and 30 weight percent, based upon the total weight percent of the total composition, preferably between about 2 and 20 weight percent as a total amount of one or more purine derivatimves. When the supplementary stabilizer component is a salt of a low molecular weight sulfonic acid, it is included at a weight percent as high as about 25 weight percent, typically between about 1 and 20 weight percent, based upon the total weight of the composition. When an inorganic salt supplementary stabilizer component is included, it can be included up to its solubility limit. An inorganic salt such as zinc chloride can be included within the composition at a weight percent from 0 to about 1 percent, based upon the total weight of the composition. When a polymer binder is included, such may be included within the emulsion at a weight percent as high as about 25 weight percent, preferably between about 5 and 20 weight percent, based upon the total weight of the composition. The balance of the emulsion composition is a solvent such as water, typically greater than about 45 weight percent and usually no greater than about 90 weight percent or above.

Especially suitable purine derivatives of the stablizing system in accordance with this invention are the theophylline derivatives, particularly those having a structure as follows:

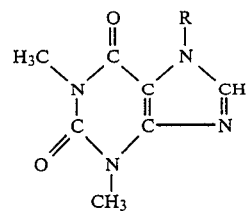

wherein R is a hydrocarbon chain of from 1 to 5 carbon atoms and having one or more hydroxy substituents. Typically, R is an alcohol, diol or triol of from 1 to 4 carbon atoms. These compounds are particularly stable within a water emulsion, and such compounds may be used alone or in combination with another such compound within the stabilizing system according to the present invention. It is important that these purine derivatives are readily water soluble or water dispersible. Exemplary theophylline derivatives suitable for use in accordance with this invention are proxyphylline, which is 7-(2-hydroxypropyl)theophylline; dyphylline, which is 7-(2,3-dihydroxypropyl)theophylline; and ethoxyphylline, which is 7-(2-hydroxyethyl)theophylline.

The supplementary stabilizing components are preferably low molecular weight sulfonic acid salts or inorganic salt stabilizers. The low molecular weight sulfonic acid salts are especially preferred because they are particularly advantageous in minimizing the likelihood that the plate will repel a lacquer or developer that is subsequently applied thereto. Other, more traditional, stabilizers such as metal salts like zinc chloride tend to be sparingly soluble within the stabilized diazonium composition according to this invention, which requires a rather strict control regarding the inclusion of such inorganic salts within the stabilized diazonium composition.

The low molecular weight alkyl sulfonic acid salts according to this invention are particularly advantageous because of their effectiveness as a supplementary stabilizer component and because they avoid solubility problems within these stabilized diazonium compositions, which problems are typically encountered with generally related salts such as the aryl sulfonic acids and salts thereof. The alkyl groups of these alkyl sulfonic acid metal salts may be unsubstituted or substituted, for example with hydroxy groups or halogens, and have a carbon chain length of between about 1 and about 6. The alkyl sulfonic acid salts that are the preferred supplementary stabilizer components include metal salts of methane sulfonic acid, of hydroxy ethane sulfonic acid, of monofluoro methane sulfonic acid, of difluoro methane sulfonic acid, of trifluoro methane sulfonic acid, of chlorine-substituted alkyl sulfonic acids, and the like.

It is typically most advantageous to prepare these low molecular weight alkyl sulfonic acid salts in situ within the stabilized diazonium composition. For example, zinc methane sulfonate is advantageously provided to the composition by separately adding, in generally stoichiometric quantities, methane sulfonic acid and a metal oxide, hydroxide or carbonate, such as zinc oxide, zinc hydroxide or zinc carbonate.

Polymer binder components may be included to assist in holding the stabilized diazonium composition together in order to enhance the homogeneity of the coated stabilized diazonium composition. The polymer binder also helps in laying down an especially smooth coating and also provides a protective film and a base to increase the oleophilic properties of the coated stabilized diazonium composition.

In order to simplify and enhance the ability of the polymer binder to be included within the stabilized diazonium composition, it is preferably provided in emulsion form. Generally speaking, these polymer binders may be acetates, acrylates, methacrylates and the like. Examples include acetate emulsions such as ethylene vinyl acetate emulsions, vinyl acetate emulsions and ethylene vinyl acetate copolymer emulsions. Other polymer binders include acrylic resin emulsions and methacrylic resin emulsions including ethyl methyl methacrylate and the like.

Many such polymer binder emulsions include coalescing solvents in order to maintain the stability of the polymer binder emulsion. When desired, coalescing solvent may be added as such to the stabilized diazonium compositions in accordance with this invention. Many coalescing solvents are well-known for assisting in binding emulsions together. Exemplary coalescing solvents include Cellosolve materials and the like, such as 2-methoxyethanol.

The diazo condensates that are included within the stabilized diazonium composition are generally known. They are light sensitive and water soluble or solvent soluble such that they are soluble within the stabilized diazonium compositions according to this invention.

Illustrative examples of diazo resins which are suitable as water dispersible diazo photosensitizers are the condensation products of an aldehyde with a diazo compound having an amine substituent such as, for example, a water soluble condensation product of a para-diazo diphenylamine and formaldehyde, such as the diazo resins manufactured by Fairmont Chemical Co. Typically, such materials are furnished as salts, such as zinc chloride salts.

Other diazo compounds which can be used include the diazo oxides such as pyrido[1,2-a]benzimidazol-8-yl13(4H)-diazo-4(3H)-oxo-1-naphthalene sulfonate. Diazonium compounds which can also be used include such materials as 4'-bromodiphenylamine-4-diazonium chloride; 4'-chlorodiphenylamine-4-diazonium chloride; 4-methoxydiphenylamine-4-diazonium chloride; 3'-methoxydiphenylamine-4-diazonium chloride; 3'-propoxydiphenylamine-4-diazonium chloride; $X,X_1,X_2$-tribromodiphenylamine-4-diazonium chloride; 4'-methyldiphenylamine-4-diazonium chloride; 4'-hydroxyldiphenylamine-4-diazonium chloride; 4'-benzoylaminodiphenylamine-4-diazonium chloride; 4'-fluorodiphenylamine-4-diazonium chloride; 2-anilidosulfonyldiphenylamine-4-diazonium chloride; 2-(p-toluene-sulfonyl-amino)diphenylamine-4-diazonium chloride; p-diazo-N-ethyl-N-benzyl aniline ½ $ZnCl_2$; 4'-diazo-2-chloro-N,N'-diethylaniline-½ $ZnCl_2$; and other similar and well known diazonium materials.

Regarding the method in accordance with this invention, the stabilized diazonium compositions described herein are prepared and coated onto a suitable base plate, typically one that has been treated, such as with a sub-base coating. The diazonium composition is then coated thereover. The stabilizing aspect of this invention is carried out by including the stabilizer system in accordance with this invention within the composition from which the diazonium compound is coated onto the base plate. When a particularly fast plate is desired, the diazonium material should be coated in as thin a layer as possible, even as thin as a generally monomolecular layer or an approximation thereof.

EXAMPLE I

A silicate sub-based anodized aluminum plate was coated with a composition of 171.4 grams (85.7 weight percent) of deionized water, 2.4 grams (1.2 weight percent) of 50% zinc chloride aqueous solution, 10 grams (5 weight percent) of dyphylline, 10 grams (5 weight percent) of 2-methoxyethanol, 0.2 gram (0.1 weight percent) of a water soluble diazo condensate, and 6 grams (3 weight percent) of ethylene vinyl acetate emulsion. This plate was subjected to accelerated aging by being kept at 160° F. for 24 hours, the plate being judged acceptable after such accelerated aging.

A substantially identical plate was prepared, except the dyphylline was omitted, and a total of 181.4 grams of deionized water were included in the emulsion. This plate failed accelerated aging at 160° F. after 16 hours.

EXAMPLE II

A plate was prepared similar to that of EXAMPLE I, the composition including 86.3 percent water, 0.6 weight percent zinc chloride, 5.0 weight percent dyphylline, 5.0 weight percent 2-methoxyethanol, 0.1 weight percent diazo condensate, and 3 weight percent ethylene vinyl acetate emulsion. This plate had a light tone after aging for 24 hours at 160° F. A similarly prepared plate was clean after 24 hours at 160° F., this particular composition being substantially identical to the previous one, except it included 85.9 weight percent water and 1 weight percent zinc chloride.

EXAMPLE III

A silicate sub-based anodized aluminum plate was coated with a diazonium composition to provide a plate that passed the 24 hour accelerated aging test at 160° F. and that, when exposed for 7 seconds, provided a solid step of 6 with a standard Kodak sensitivity guide. The diazonium composition included 88.9 weight percent deionized water, 1 weight percent zinc chloride, 2 weight percent dyphylline, 5 weight percent 2-methoxyethanol, 0.1 weight percent diazo resin, and 3 weight percent ethylene vinyl acetate emulsion.

EXAMPLE IV

The following composition was coated onto a silicate sub-based anodized aluminum plate: 96 weight percent deionized water, 1 weight percent zinc chloride, 4 weight percent dyphylline, 5 weight percent 2-methoxyethanol, 1 weight percent of a water soluble diazo resin, and 3 weight percent ethylene vinyl acetate emulsion. When this plate was compared with a commercially available presensitized lithographic plate having a diazonium layer that does not include dyphylline or any other theophylline derivative, both plates had substantially the same photospeed, the commercial plate being totally scummed after 48 hours at 160° F., while the prepared plate had only a light tone after 48 hours at 160° F.

EXAMPLE V

After 17 hours of accelerated aging at 160° F., a plate prepared with the following diazo composition exhibited a solid step 5 after exposure for 5 BAU., the composition including about 88 weight percent deionized water, 0.75 weight percent zinc chloride, 4 weight percent dyphylline, 5 weight percent 2-methoxyethanol, 0.2 weight percent diazo resin, and 2 weight percent carboxylated ethylene vinyl acetate emulsion.

EXAMPLE VI

Silicate sub-based, anodized aluminum plates were acceptable after aging for 18 hours at 160° F. and gave a step solid of 6 for 5 BAU., the diazo composition of this plate including 147.86 grams of deionized water, 2.0 grams of zinc chloride, 10 grams of proxyphylline, 10 grams of dyphylline, 0.14 grams of diazo resin, and 30 grams of a carboxylated ethylene vinyl acetate emulsion.

EXAMPLE VII

Diazo composition of 68.95 weight percent deionized water, 1 weight percent zinc chloride, 5 weight percent proxyphylline, 5 weight percent dyphylline, 0.05 weight percent diazo, and 20 weight percent carboxylated ethylene vinyl acetate emulsion was coated onto an anodized aluminum plate. This coated plate was acceptable after aging for 16 hours at 160° F., and gave a solid step 7 for 5 BAU.

EXAMPLE VIII

Especially stable lithographic plates that did not repel the lacquer or developer subsequently applied thereto were prepared by coating a silicate sub-based anodized aluminum plate with the following composition: 59.93 weight percent deionized water, 4 weight percent zinc carbonate, 6 weight percent methane sulfonic acid, 5 weight percent dyphylline, 5 weight percent proxyphylline, 0.07 weight percent diazo, 15 weight percent of an acrylic emulsion, and 5 weight percent of a carboxylated ethylene vinyl acetate emulsion. This plate had an acceptable shelf life when subjected to 160° F. for 24 hours.

EXAMPLE IX

A lithographic plate was prepared with a diazo composition including 61.28 weight percent of deionized water, 2.52 weight percent of zinc ozide, 6 weight percent of methane sulfonic acid, 5 weight percent of proxyphylline, 5 weight percent of dyphylline, 0.2 weight percent of a water soluble diazonium resin, 15 weight percent of a vinyl acetate emulsion, and 5 weight percent of a carboxylated ethylene vinyl acetate emulsion. This plate gave a solid step 5 for 5 BAU., and this plate did not scum after aging for 24 hours at 160° F.

EXAMPLE X

A plate that showed no scumming after aging for 24 hours at 160° F. and that gave a solid step 5 for 5 BAU. included a diazonium layer laid down from a composition of 83.54 weight percent water, 1.89 weight percent zinc oxide, 4.5 weight percent methane sulfonic acid, 5 weight percent dyphylline, 0.07 weight percent diazo resin, and 5 weight percent carboxylated ethylene vinyl acetate emulsion.

EXAMPLE XI

A plate was prepared by coating the following composition onto a silicate sub-based anodized aluminum plate: 49 weight percent deionized water, 21 weight percent zinc methane suffonate, 10 weight percent dyphylline, 0.07 weight percent diazo resin, and 20 weight percent carboxylated ethylene vinyl acetate emulsion. This plate showed only moderate scumming after being held for 64 hours in an oven at 160° F., the plate producing a solid step 6 for 5 BAU.

EXAMPLE XII

A plate that gave a solid step 5 for 5 BAU. and no significant scumming after 24 hours at 160° F. included the following diazo compositions: 74.9 weight percent deionized water, 5 weight percent zinc oxide, 12 weight percent methane sulfonic acid, 5 weight percent dyphylline, 0.1 weight percent diazo resin, and 3.0 weight percent ethyl methyl methacrylate resin emulsion.

EXAMPLE XIII

A coating composition was prepared that included 86.9 weight percent deionized water, 1.0 weight percent zinc chloride, 5.0 weight percent proxyphylline, 5.0 weight percent 2-methoxyethanol, 0.1 weight percent diazo resin, and 2.0 weight percent of a carboxylated ethylene vinyl acetate emulsion. The composition was coated onto a plate, giving a solid step 5 for 5 BAU.

EXAMPLE XIV

A composition including the following components was satisfactorily coated onto a plate and produced a plate that passed the shelf stability test: 78.93 weight percent water, 1.0 weight percent zinc chloride, 5.0 weight percent ethoxyphylline, 5.0 weight percent dyphylline, 0.07 weight percent diazo resin, and 10.0 weight percent carboxylated ethylene vinyl acetate emulsion.

EXAMPLE XV

A plate was prepared with the following diazonium composition: 61.25 weight percent water, 2.52 weight percent zinc oxide, 6 weight percent methane sulfonic acid, 5 weight percent dyphylline, 5 weight percent proxyphylline, 0.2 weight percent diazo resin, and 20 weight percent methacrylic resin emulsion. This plate passed the accelerated aging test at 160° F. for 16 hours, no scumming being evident.

EXAMPLE XVI

A plate that passed the 24 hour aging test at 160° F. included the following diazo composition: 63.75 weight percent water, 10 weight percent zinc isethionate (zinc 2-hydroxyethane sulfonate), 5 weight percent dyphylline, 1 weight percent proxyphylline, 0.25 weight percent diazo resin, and 20 weight percent ethyl methyl methacrylate emulsion.

EXAMPLE XVII

A composition of 76.3 weight percent deionized water, 6 weight percent methane sulfonic acid, 2.5 weight percent zinc oxide, 5 weight percent dyphylline, 5 weight percent proxyphylline, 0.2 weight percent diazo resin, and 5 weight percent vinyl acetate emulsion was coated onto a silicate sub-based anodized aluminum plate. The thus prepared plate passed the accelerated aging test for 24 hours at 160° F.

It will be understood that the embodiments of the present invention which have been described are merely illustrative of a few of the applications of the principals of the present invention. Numerous modifications may be made by those skilled in the art without departing from the true spirit and scope of the invention.

What is claimed is:

1. An article having a stabilized photosensitive diazonium composition coated thereonto, said stabilized diazonium composition comprising a coating from a composition consisting essentially of a solvent, a photosensitive diazonium resin and a stabilizing system, said stabilizing system including a purine derivative, said purine derivative being at a concentration that is effective in enhancing the stability of the photosensitive diazonium resin coated on the article and that is no greater than a concentration at which the purine derivative is dispersible within said composition, wherein said purine derivative is a theophylline derivative of the structural formula:

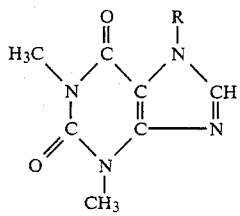

wherein R is hydrocarbon chain of from 1 to 5 carbon atoms and has one or more hydroxy substituents.

2. The stabilized plate according to claim 1, wherein said stabilizing system further consists essentially of a supplementary stabilizer component salt, said supplementary stabilizer component being at a concentration that is no greater than a concentration at which the supplementary stabilizer component is dispersible within said composition.

3. The stabilized plate according to claim 2, wherein said supplementary stabilizer salt is a salt of a low molecular weight alkyl sulfonic acid.

4. The stabilized plate according to claim 2, wherein said supplementary stabilizer salt is an inorganic metal salt.

5. The stabilized plate according to claim 2, wherein said supplementary stabilizer salt is selected from the group consisting of a metal salt of a low molecular weight alkyl sulfonic acid, an inorganic metal salt, and combinations thereof.

6. The stabilized plate according to claim 1, wherein said stabilized diazonium composition includes further consists essentially of a polymer binder.

7. The stabilized plate according to claim 1, wherein said stabilized diazonium composition includes further consists essentially of a polymer binder selected from the group consisting of acetates, acrylates and methacrylates.

8. The stabilized plate according to claim 1, wherein said purine derivative is a theophylline derivative selected from the group consisting of dyphylline, proxyphylline and ethoxyphylline.

9. The stabilized plate according to claim 1, wherein the stabilized photosensitive diazonium composition includes at least about 45 weight percent of said water, between about 0.03 and 3 weight percent of said diazonium resin, and between about 1 and 30 weight percent of said purine derivative, all percentages being based on the total weight of the composition.

10. The stabilized plate according to claim 2, wherein said supplementary stabilizer component is included at a concentration of up to about 20 weight percent, based upon the total weight of the composition.

11. The stabilized plate according to claim 3, wherein said supplementary stabilizer component is included at a concentration of between about 5 and 15 weight percent, based upon the total weight of the composition.

12. The stabilized plate according to claim 6, wherein said polymer binder is included at a concentration of up to about 25 weight percent, based upon the total weight of the composition.

13. The stabilized plate according to claim 1, wherein the plate includes a plate base under said coating from the stabilized diazonium composition.

14. A presensitized plate including a plate base, a sub-base coating on the plate base, and a diazonium composition overlying the sub-base coating, said diazonium composition being a stabilized diazonium composition comprising a coating laid down from a composition consisting essentially of a solvent, a photosensitive diazonium resin and a stabilizing system, said stabilizing system including a purine derivative, said purine derivative being at a concentration that is effective in enhancing the stability of the photosensitive diazonium resin coated on the plate and that is no greater than a concentration at which the purine derivative is dispersible within said composition, wherein said purine derivative is a theophylline derivative of the structural formula:

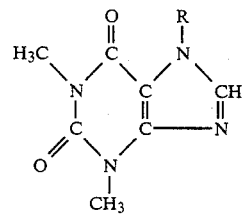

wherein R is hydrocarbon chain of from 1 to 5 carbon atoms and having one or more hydroxy substituents.

15. The presensitized plate according to claim 14, wherein said stabilizing system further consists essentially of a supplementary stabilizer component that is a salt of a low molecular weight non-aromatic alkyl sulfonic acid.

16. A method for stabilizing a diazonium component of a plate, comprising:
preparing a composition consisting essentially of a solvent, a photosensitive diazonium resin and a stabilizing system, said stabilizing system including a purine derivative, said purine derivative being at a concentration that is effective in enhancing the stability of the photosensitive diazonium resin coated on the plate and that is no greater than a concentration at which the purine derivative is dispersible within said composition, wherein said purine derivative is a theophylline derivative of the structural formula:

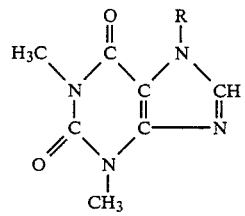

wherein R is hydrocarbon chain of from 1 to 5 carbon atoms and having one or more hydroxy substituents; and coating said composition onto a plate base in order to lay down a thin layer of stabilized photosensitive diazonium resin.

17. The stabilizing method according to claim 15, wherein said stabilizing system further consists essentially of a supplementary stabilizer component that is a salt of a non-aromatic alkyl sulfonic acid.

* * * * *

UNITED STATES PATENT AND TRADEMARK OFFICE
CERTIFICATE OF CORRECTION

PATENT NO. : 4,499,170
DATED : February 12, 1985
INVENTOR(S) : Luigi Amariti and Llandro C. Santos It is certified that error appears in the above—identified patent and that said Letters Patent is hereby corrected as shown below:

Title of the patent should read:  --ARTICLES HAVING STABILIZED PHOTOSENSITIVE DIAZO RESIN LAYER--.
Column 2, line 41, "deatiled" should read --detailed--.
Column 3, line 16, delete "a" after "and"; line 44, "derivatimves" should read --derivatives--; line 65, " stablizing" should read --stabilizing--.
Column 4, line 58, "in situ" should read --in situ--.
Column 5, line 40, that portion of the formula reading "-yl13(4H)-" should read -- -yl3(4H)- --.
Column 7, line 65, "suffonate" should read --sulfonate--.
Column 8, line 7, "compositions:" should read --composition:--.
Column 9, lines 27, 34, 37, 40, and 45, "plate" should read --article--; line 46, delete "includes"; line 48, "plate" should read --article--; line 49, delete "includes"; lines 53, 57, and 65, "plate" should read --article--.
Column 10, lines 1, 5, and 9, "plate" should read --article--; line 10, "plate" (first occurrence) should read --article--; line 13, "on-the" should read --on the--.

Signed and Sealed this

Twenty-second Day of October 1985

[SEAL]

Attest:

DONALD J. QUIGG

Attesting Officer

Commissioner of Patents and Trademarks—Designate